United States Patent
Liikanen

(10) Patent No.: US 10,754,583 B2
(45) Date of Patent: Aug. 25, 2020

(54) LEVEL WIDTH BASED DYNAMIC PROGRAM STEP CHARACTERISTIC ADJUSTMENT

(71) Applicant: Micron Technology, Inc., Boise, ID (US)

(72) Inventor: Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 16/214,349

(22) Filed: Dec. 10, 2018

(65) Prior Publication Data

US 2020/0183615 A1 Jun. 11, 2020

(51) Int. Cl.
| | |
|---|---|
| G06F 12/00 | (2006.01) |
| G06F 3/06 | (2006.01) |
| G11C 16/10 | (2006.01) |
| G11C 11/56 | (2006.01) |
| G06F 13/00 | (2006.01) |
| G06F 13/28 | (2006.01) |
| G11C 16/04 | (2006.01) |

(52) U.S. Cl.
CPC .......... *G06F 3/0659* (2013.01); *G06F 3/0604* (2013.01); *G06F 3/0679* (2013.01); *G11C 11/5628* (2013.01); *G11C 16/10* (2013.01); *G11C 16/0483* (2013.01)

(58) Field of Classification Search
CPC .... G06F 3/0659; G06F 3/0604; G06F 3/0679; G11C 16/10; G11C 11/5628; G11C 16/0483
See application file for complete search history.

(56) References Cited

U.S. PATENT DOCUMENTS

| | | | | |
|---|---|---|---|---|
| 6,285,588 B1* | 9/2001 | Fastow | ............ | G11C 16/14 |
| | | | | 365/185.19 |
| 6,822,909 B1* | 11/2004 | Hamilton | ............ | G11C 11/5671 |
| | | | | 365/185.24 |
| 8,862,969 B2 | 10/2014 | Liikanen et al. | | |
| 9,299,443 B1* | 3/2016 | Dong | ............ | G11C 16/10 |
| 2008/0123406 A1* | 5/2008 | Ho | ............ | G11C 11/5628 |
| | | | | 365/185.03 |
| 2009/0129168 A1* | 5/2009 | Kim | ............ | G11C 16/0483 |
| | | | | 365/185.19 |
| 2018/0341552 A1 | 11/2018 | Liikanen et al. | | |

OTHER PUBLICATIONS

U.S. Appl. No. 15/981,835, entitled "Memory System Quality Margin Analysis and Configuration", filed May 16, 2018, (40 pgs.).
U.S. Appl. No. 16/182,399, entitled "Memory Element Profiling and Operational Adjustments", filed Nov. 6, 2018, (34 pgs.).
U.S. Appl. No. 16/121,565, entitled "Memory Characterization and Sub-System Modification", filed Sep. 4, 2018, (41 pgs.).

\* cited by examiner

*Primary Examiner* — Mark A Giardino, Jr.
(74) *Attorney, Agent, or Firm* — Brooks, Cameron & Huebsch, PLLC

(57) ABSTRACT

A level width corresponding to a group of memory cells of a memory component is determined. The determined level width and a target level width is compared. In response to the determined level width being different than the target level width, one or more program step characteristics are adjusted to adjust the determined level width to the target level width.

20 Claims, 11 Drawing Sheets

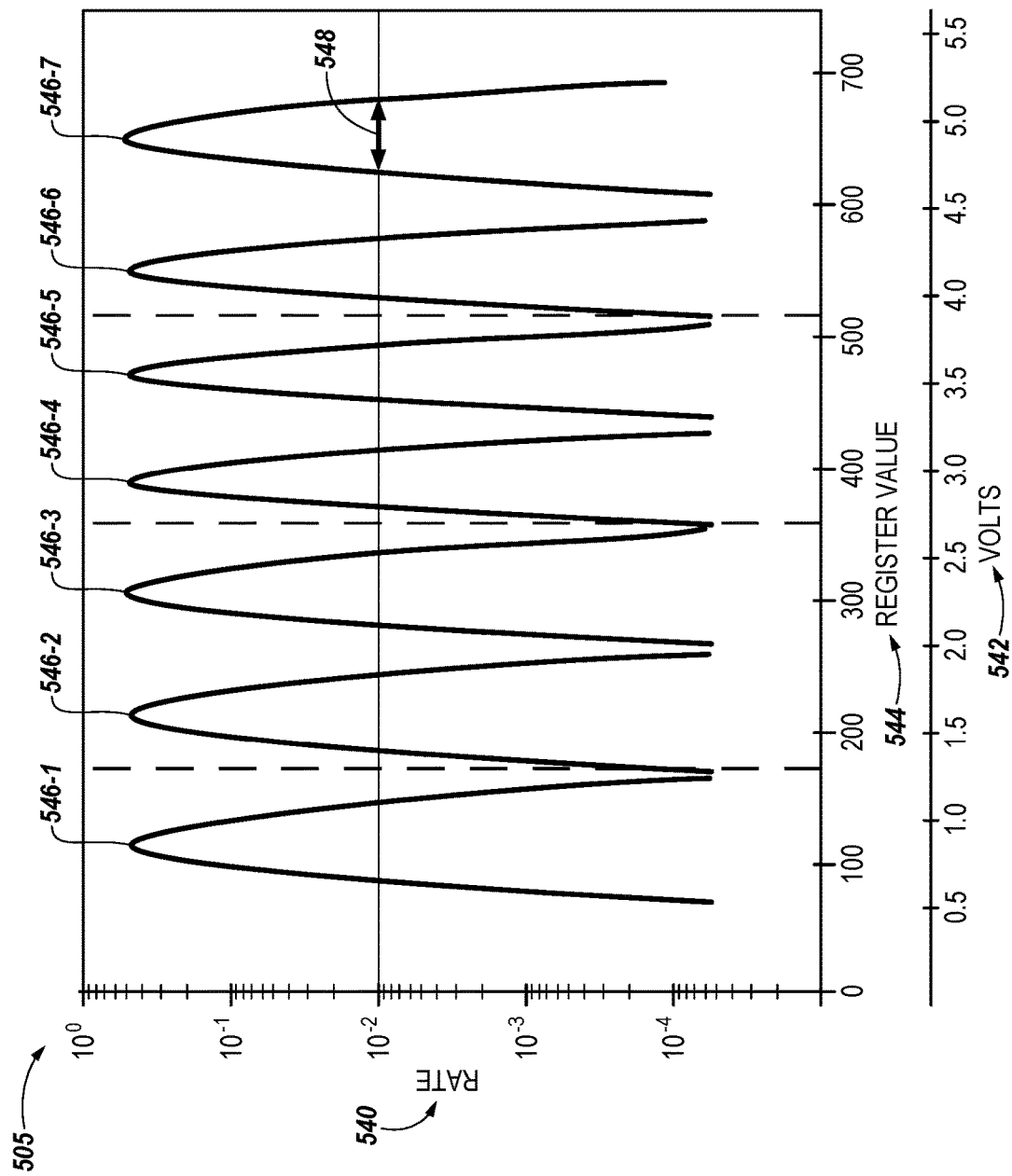

LEVEL WIDTH BASED DYNAMIC PROGRAM STEP CHARACTERISTIC ADJUSTMENT

TECHNICAL FIELD

Embodiments of the disclosure relate generally to memory sub-systems, and more specifically, relate to level width based program step characteristic adjustment.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 5 illustrates at least a portion of a level width among example threshold voltage distributions of a particular page of memory cells in accordance with some embodiments of the present disclosure.

DETAILED DESCRIPTION

Figure 1:
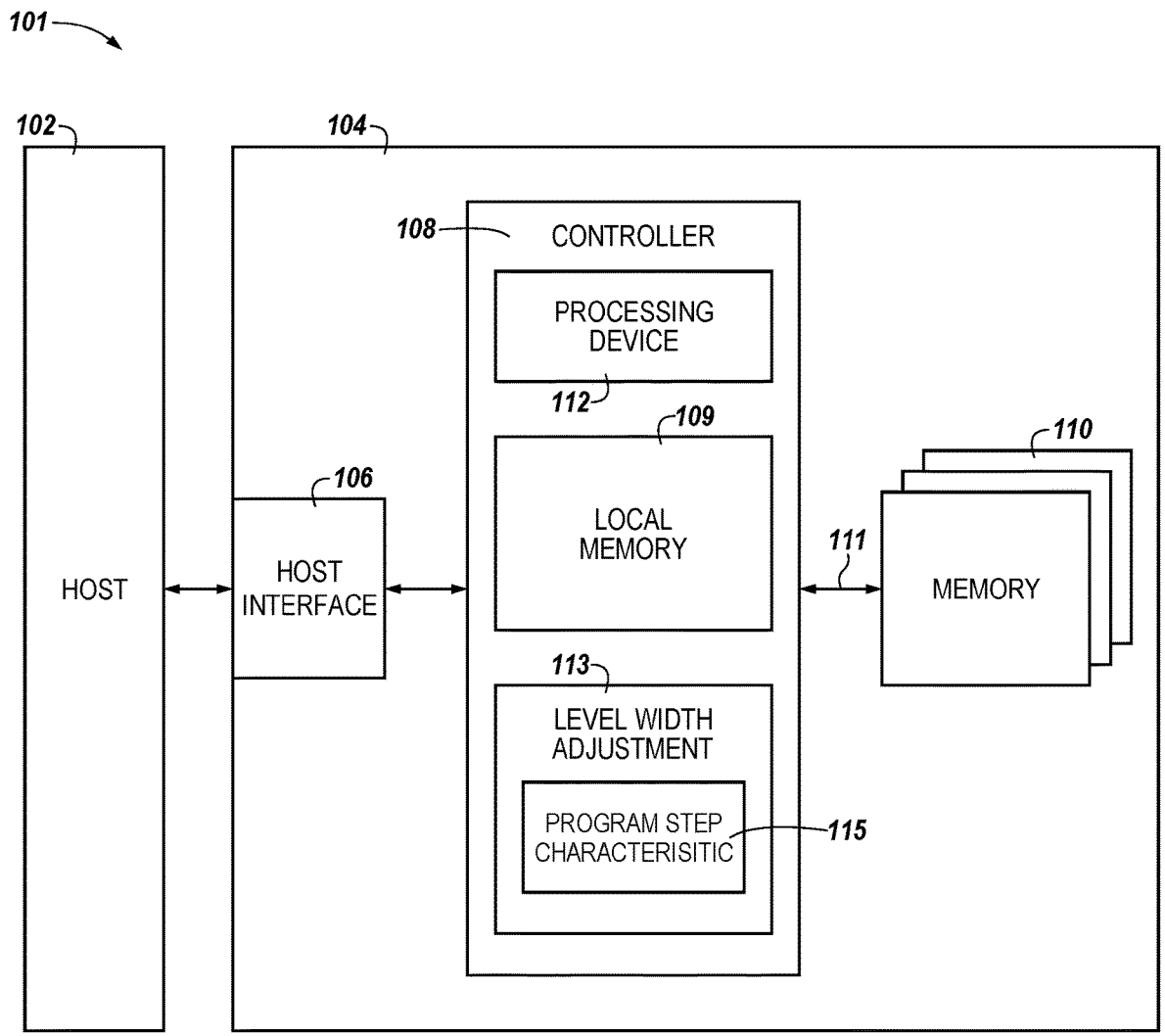
FIG. 1 illustrates an example computing environment that includes a memory sub-system in accordance with some embodiments of the present disclosure.

Aspects of the present disclosure are directed to managing level width within a memory sub-system. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

In various memory sub-systems, programming cells can involve providing a programming signal to a group of cells (e.g., a page) to place them in target states, which correspond to respective stored data patterns. For example, the cells can be non-volatile flash memory cells configured to store one or more bits of data per cell. As an example, a programming signal used to program the cells can comprise a stepped voltage signal (e.g., voltage ramp) with each step having an associated step size and duration. The programming signal can be applied (e.g., to a word line) as a series of voltage pulses, for instance. The voltage pulses have various characteristics which can affect a level width associated with the programmed cells. Such characteristics include pulse magnitude, step size between pulses, and pulse duration, among various other characteristics.

As described further herein, a level width refers to a width (e.g., in voltage) of a threshold voltage (Vt) distribution corresponding to a state to which a number of memory cells are programmed. As such, a level width may be referred to herein as a distribution level width. The memory cells can be multilevel memory cell (MLCs) each programmable to multiple voltage levels (e.g., 4 levels, 8 levels, 16 levels, etc.) such that the cells can store multiple bits of data per cell (e.g., 2 bits, 3 bits, 4 bits, etc.). A level width for a group of programmed cells can refer to the width of a particular Vt distribution among multiple Vt distributions or can refer to a sum of level widths for up to all of the multiple Vt distributions corresponding to respective program states (e.g., voltage levels corresponding to respective program states) for a group of cells. As described further below, a level width can be determined (e.g., measured) at a particular bit error rate (BER), for example. The level width corresponding to a group of memory cells can be affected by various factors such as temperature, wear cycling (e.g., program/erase cycles), etc. Therefore, the level width(s) of a system can vary over time, which can affect system quality of service (QoS), reliability, and/or performance. In various instances, it can be beneficial to maintain a specified level width in order to maintain a particular system characteristic (e.g., QoS, error rate, etc.) across various environmental conditions and/or user workloads. However, it can also be beneficial to provide the ability to dynamically adjust a level width (e.g., to a target level width value) in order to change one or more system characteristics. For instance, it may be beneficial to provide one system, or components thereof, with a relatively high level width associated with low reliability (e.g., high bit error rate) and another system, or components thereof, with a relatively low level width associated with higher speed. It can also be beneficial to adjust the level width of a particular system or component thereof such that the system operates at different reliability levels and speed at different times.

Conventional memory sub-systems do not dynamically adjust level widths and/or are not be capable of adjusting the level widths in a predictable and/or controllable manner. Therefore, various conventional systems are not able to, for example, maintain a target level width with changing temperature and/or program/erase cycling.

In contrast, embodiments of the present disclosure address the above and other deficiencies by providing a memory sub-system capable of finely controlling (e.g., tuning) a level width in a more efficient manner as compared to previous approaches. For example, embodiments are capable of to achieving and maintaining a target level width by modifying one or more characteristics of voltage signals (e.g., pulses) used to program memory cells. Such a memory sub-system can provide various benefits such as those described above. For instance, embodiments can control a level width to maintain a particular level of quality, reliability, and/or performance of the system in various environmental conditions and/or user workloads.

FIG. 1 illustrates an example computing environment 101 that includes a memory sub-system 104 in accordance with some embodiments of the present disclosure. The memory sub-system 104 can include media, such as memory components 110. The memory components 110 can be volatile memory components, non-volatile memory components, or a combination of such. In some embodiments, the memory sub-system is a storage system. An example of a storage system is a SSD. In some embodiments, the memory sub-system 104 is a hybrid memory/storage sub-system. In general, the computing environment 100 can include a host system 102 that uses the memory sub-system 104. For example, the host system 102 can write data to the memory sub-system 104 and read data from the memory sub-system 104.

Host 102 can be a host system such as a personal laptop computer, a desktop computer, a digital camera, a mobile telephone, or a memory card reader, among various other types of hosts. Host 102 can include a system motherboard and/or backplane and can include a number of processors. Host 102 can also be a processing resource, such as where memory sub-system 104 is a memory device having an on-die controller (e.g., 108).

The host system 102 can be coupled to the memory sub-system 104 via a physical host interface 106. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory 104. The host system 102 can further utilize an NVM Express (NVMe) interface to access the memory components 110 when the memory sub-system 104 is coupled with the host system 102 by a PCIe interface. The physical host interface can provide an interface for passing control, address, data, and other signals between the memory sub-system 104 and the host system 102. The memory components 110 can include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device can be configured to store 8 KB (kilobytes) of user data per page, 128 pages of user data per block, 2048 blocks per plane, and 16 planes per device. The memory components 110 can also include additionally circuitry (not illustrated), such as control circuitry, buffers, address circuitry, etc.

In operation, data can be written to and/or read from memory (e.g., memory components 110 of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

The memory components 110 can include any combination of the different types of non-volatile memory components and/or volatile memory components. An example of non-volatile memory components includes a negative- and (NAND) type flash memory. The memory components 110 can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 102. Although non-volatile memory components such as NAND type flash memory are described, the memory components 110 can be based on various other types of memory such as a volatile memory. In some embodiments, the memory components 110 can be, but are not limited to, random access memory (RAM), read-only memory (ROM), dynamic random access memory (DRAM), synchronous dynamic random access memory (SDRAM), phase change memory (PCM), magneto random access memory (MRAM), negative- or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 110 can be grouped as memory pages or data blocks that can refer to a unit of the memory component used to store data.

As illustrated in FIG. 1, the memory sub-system 104 can include a controller 108 coupled to the host interface 106 and to the memory components 110 via a memory interface 111. The controller 108 can be used to send data between the memory sub-system 104 and the host 102. The memory interface 111 can be one of various interface types compliant with a particular standard such as Open NAND Flash interface (ONFi).

The controller 108 can communicate with the memory components 110 to perform operations such as reading data, writing data, or erasing data at the memory components 110 and other such operations. The controller 108 can include hardware such as one or more integrated circuits and/or discrete components, a buffer memory, or a combination thereof. The controller 108 can be a microcontroller, special purpose logic circuitry (e.g., a field programmable gate array (FPGA), an application specific integrated circuit (ASIC), etc.), or other suitable processor. The controller 108 can include a processor (e.g., processing device 112) configured to execute instructions stored in local memory 109. In the illustrated example, the local memory 109 of the controller 108 includes an embedded memory configured to store instructions for performing various processes, operations, logic flows, and routines that control operation of the memory sub-system 104, including handling communications between the memory sub-system 104 and the host system 102. In some embodiments, the local memory 109 can include memory registers storing memory pointers, fetched data, etc. The local memory 109 can also include read-only memory (ROM) for storing micro-code. While the example memory sub-system 104 in FIG. 1 has been illustrated as including the controller 108, in another embodiment of the present disclosure, a memory sub-system 104 may not include a controller 108, and may instead rely upon external control (e.g., provided by an external host, such as by a processing device separate from the memory sub-system 104).

The controller 108 can use and/or store various operating parameters associated with operating (e.g., programming and/or reading) the memory cells. Such operating parameters may be referred to as trim values and can include programming pulse magnitude, step size, pulse duration, program verify voltages, read voltages, etc. for various different operating processes. The different processes can include processes to program cells to store different quantities of bits, and different multiple pass programming process types (e.g., 2-pass, 3-pass, etc.). The controller 108 can be responsible for other operations such as wear leveling operations, garbage collection operations, error detection and/or correction (e.g., error-correcting code (ECC)) operations, encryption operations, caching operations, and address translations between a logical block address and a physical block address that are associated with the memory components 110.

The memory sub-system 104 can also include additional circuitry or components that are not illustrated. For instance, the memory components 110 can include control circuitry, address circuitry (e.g., row and column decode circuitry), and/or input/output (I/O) circuitry by which they can communicate with controller 108 and/or host 102. As an example, in some embodiments, the address circuitry can receive an address from the controller device 108 and decode the address to access the memory components 110.

In various embodiments, the controller 108 can include a level width adjustment component 113 that controls and/or communicates with a program step characteristic component 115 to determine and/or control one or more program step characteristics used to program cells. The program step characteristics can include, for example, various characteristics of voltage pulses used to program memory cells of the memory components 110. The characteristic can be, for example, a voltage difference between (e.g., two consecutive) voltage pulses used to program memory cells. In another example, the characteristic can be a duration for which voltage pulse(s) are applied to program memory cells. As used herein, the voltage difference between voltage pulses can be referred to as a program step size, and the duration for which voltage pulse(s) are applied can be referred to as a program step duration.

The memory components 110 can include memory cells for the write or program operation, such as for incremental step pulse programming (ISPP). The memory cells can be programmed (via controller) via an ISPP process in which a series of pulses of increasing magnitude are applied to the cells (to their gates) to increase the stored charge by a particular amount until the target stored charge (Vt) is reached.

Figure 2:
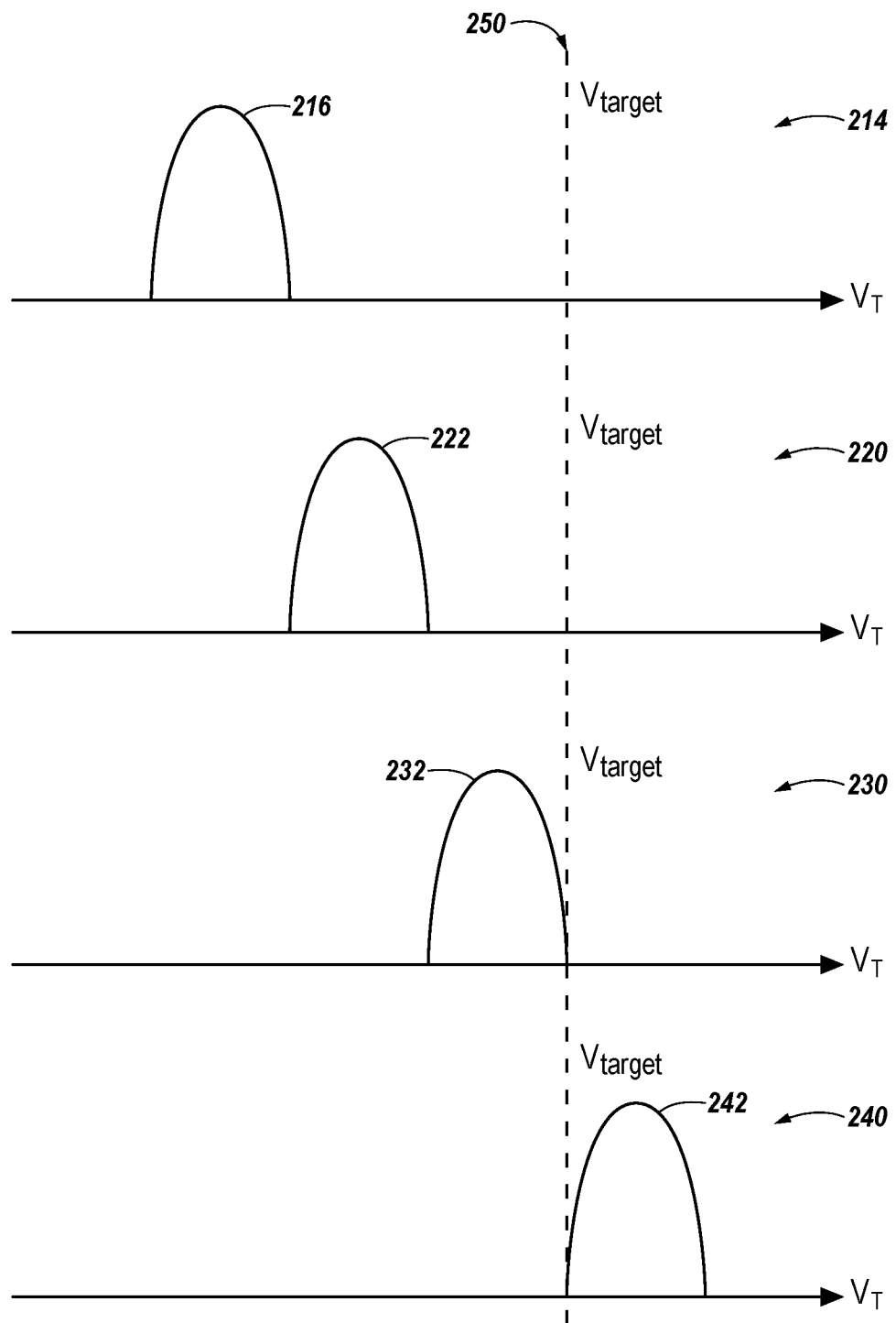
FIG. 2 illustrates an example of programming memory cells in accordance with some embodiments of the present disclosure.

For example, FIG. 2 illustrates threshold voltage (Vt) distributions of cells, which correspond to the charge stored on the charge storage structures of the memory cells, at various stages of one such incremental programming operation. Time 214 can represent a time at which the programming operation begins. Accordingly, as shown by Vt distribution 216 at time 214, the Vt of all the cells is below the target Vt level (Vtarget) 250. To program the memory cells to the desired target Vtarget 250, a series of programming steps (e.g., voltage pulses) can be used at each of a number of subsequent times 220, 230, and 240 to increase the cell Vt levels as shown by distributions 222, 232, and 242, respectively. After each programming step, a program verify operation can be performed to verify whether the cells being programmed have reached Vtarget 250. As shown in FIG. 2, programming of the cells is completed at time 240, as the Vt levels of all the cells have been increased to at or above the desired target Vt level 250, the programming operation is completed.

The amount by which the Vt distributions 216, 222, 232, and 242 increase responsive to an applied programming pulse can depend on various factors such as the magnitude of the pulse and the duration for which the pulse is applied to the cells. Accordingly, the time to program a group of cells to desired states can vary depending upon the programming signal characteristics as well as the quantity of pulses. Additionally, as described further below, multiple programming passes can be used to program multiple logical page data to cells. For example, a first pass, which can be referred to as a lower page programming process, can be used to program one or more lower pages of data to a group of cells, and one or more subsequent programming passes can be used to program additional pages of data to the group of cells.

Figure 3:
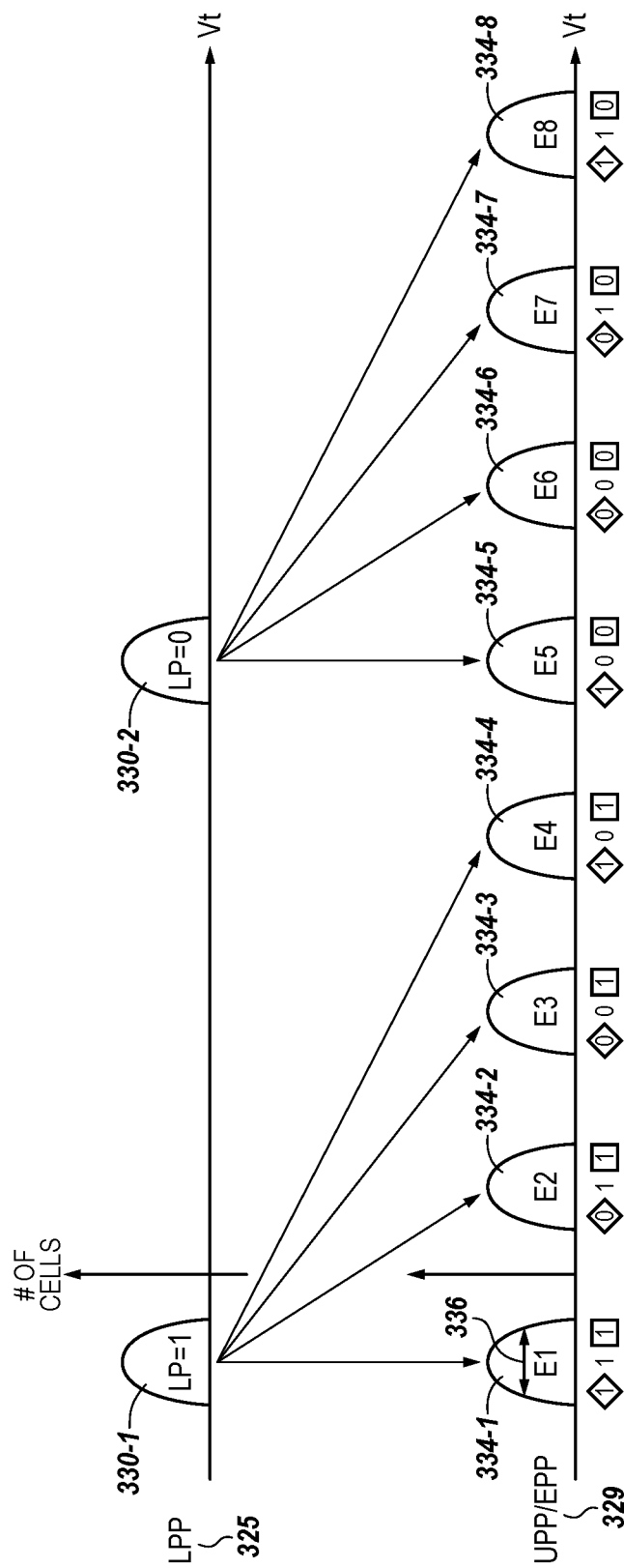
FIG. 3 illustrates threshold voltage distributions associated with a programming process in accordance with some embodiments of the present disclosure.

The diagram shown in FIG. 3 illustrates threshold voltage (Vt) distributions associated with a programming process in accordance with embodiments of the present disclosure. In this example, the process is a two-pass programming process in which a lower page (e.g., lease significant bit) of a group of memory cells is programmed in a first programming pass and an upper page (e.g., middle bit) and extra page (e.g., most significant bit) of the group are programmed in a second programming pass. The first programming pass can be referred to as a lower page programming (LPP) process 325, and the second programming pass can be referred to as an upper page programming and extra page programming process (UPP/EPP) 329.

As described further below, each of the LPP process 325 and UPP/EPP process 329 can involve application of a series of programming pulses to a selected word line corresponding to the group of cells being programmed. As part of the LPP process 325, the Vt of the memory cells are adjusted (e.g., from an erased Vt level) to one of two levels represented by Vt distributions 330-1 and 330-2. The voltage levels are represented by Vt distributions, which can reflect a statistical average Vt level of cells programmed to a particular level. In this example, cells whose lower page is to store a bit value of "1" (e.g., LP=1) are programmed to distribution 330-1 during LPP process 325, and cells whose lower page is to store a bit value of "0" (e.g., LP=0) are programmed to distribution 330-2 during LPP process 325.

A lower page is a lower order page and is programmed in the array of memory cells before higher order pages are programmed.

As part of the UPP/EPP process 329, the Vt of the memory cells are adjusted to one of eight levels represented by Vt distributions 334-1 to 334-8, which correspond to data states E1 to E8, respectively, with each one of the data states E1 to E8 representing a different 3-bit stored data pattern. In this example, cells programmed to data state E1 store data "111," cells programmed to data state E2 store data "011," cells programmed to data state E3 store data "001," cells programmed to data state E4 store data "101," cells programmed to data state E5 store data "100," cells programmed to data state E6 store data "000," cells programmed to data state E7 store data "010," and cells programmed to data state E8 store data "110." While the example illustration includes a 2-pass programming, this is but one example. Additional quantities of program passes can be used.

FIG. 3 also illustrates a level width 336 corresponding to data E1 (e.g., respective voltage distribution 334-1), and likewise, while not illustrated, additional level widths correspond to E2 through E8 (e.g., respective Vt distributions 334-2 through 334-8). The level widths for cells programmed to one of states E1 to E8 can refer to the sum of the level widths. As described below in association with FIG. 4C, respective level widths can be measured at a particular (e.g., target) BER (e.g., BER 443 shown in FIG. 4C).

Particular level widths (such as level width 336) can be determined for a group of memory cells. The group of cells can be, for example one or more pages of cells of the memory components 110. The group of cells can also be one or more blocks of memory cells, such as blocks of cells erased together in a particular erase operation. The one or more pages and/or the one or more blocks can be from a particular memory component (e.g., die) or from multiple dies. The group of memory cells for which a level width is determined can be randomly selected or can be all of the pages of a memory component (e.g., 110) or system (e.g., 104), for instance; however, embodiments are not so limited. As described further herein, in a number of embodiments, a determined level width can be adjusted (e.g., increased or decreased) by adjusting one or more programming pulse characteristics to achieve a target level width for the group of memory cells. For example, the determined level width can be compared to the target level width, and at least one of a program step size and a program step duration can be adjusted in order to move the measured level width toward the target level width. In response to determining that the determined level width satisfies a threshold pertaining to the target level width, the step size and the program step duration can each be increased by a respective particular amount. In response to determining that the determined level width satisfies a threshold pertaining to the target level width, the step size and the program step duration can each be decreased by a respective particular amount.

Further details of measuring and adjusting the level width is described below in connection with FIG. 4-10.

Figure 4A:
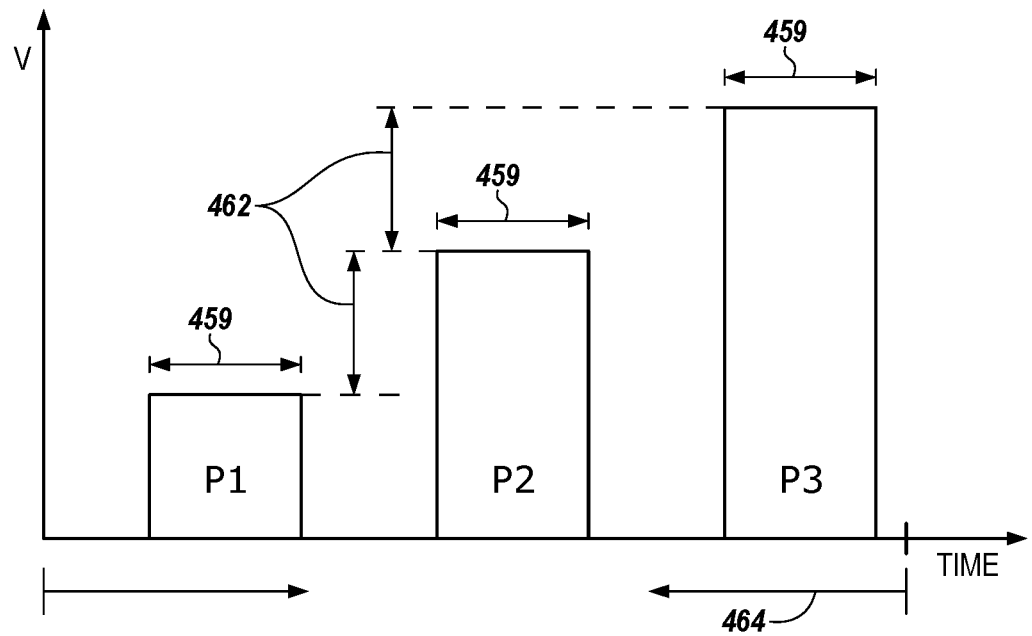
FIG. 4A-4B illustrate example programming steps whose characteristics can be adjusted in association with adjusting a level width in accordance with some embodiments of the present disclosure.
Figure 4B:
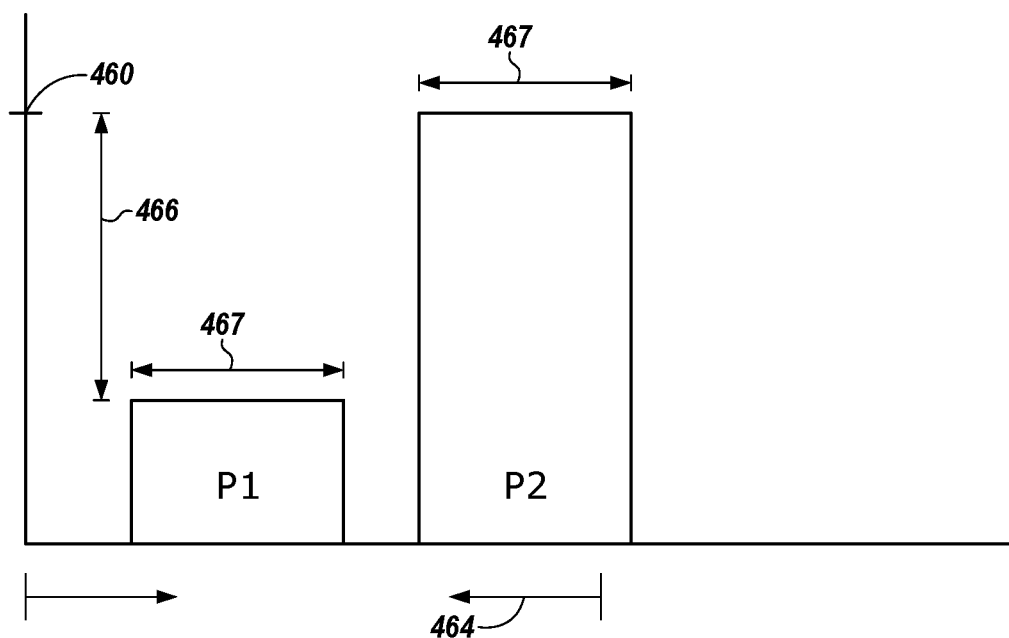

FIG. 4A-B each illustrate example programming signals in accordance with embodiments of the present disclosure. The example illustrations represent programming pulses applied to memory cells (e.g., to their gates) to increase the cell threshold voltages (Vts) to target levels. FIG. 4A illustrates a number of pulses P1, P2, and P3 associated with a programming operation having a particular PET 464. As shown in FIG. 4A, each pulse has a pulse duration 459, which may be referred to as a program step duration, and a program step size 462 between consecutive pulses.

The PET 464 can be associated with a series of pulses (e.g., P1, P2, P3) applied to a group of cells to place the cells of the group in respective target states. For example, the PET 464 can correspond for the amount of time to program each of a group of cells to one of the states E1 to E8 shown in FIG. 3. Memory systems in accordance with embodiments described herein can dynamically adjust (e.g., increase or decrease) the programming step size 462 and/or step duration 459 in order to achieve a desired level width adjustment (e.g., to maintain a desired level width). In at least one example, this dynamic increase or decrease can be performed by the program step characteristic component 115 to dynamically adjust or calibrate the programming step size 462 and/or duration 459

FIG. 4B illustrates the programming operation shown in FIG. 4A after implementing a programming step adjustment. For comparison, the previous program step size and program step durations, such as 462 and 459, respectively, in FIG. 4A, are illustrated. The adjusted program step size 466 is a calibrated or changed instance of the program step size 462 for replacing the program step size 462. The adjusted program step size 466 is illustrated as being greater than the program step size 462, however, adjustments can be an increase or a decrease in the program step size. Likewise, the adjusted program step duration 467 is a calibrated or changed instance of the program step duration 459 for replacing the program step duration 459. The adjusted program step duration 467 is illustrated as being greater than the program step duration 459, however, adjustments can be an increase or a decrease in the program step duration depending on a desired change in the level width. In the example shown in FIGS. 5A and 5B, the adjustments to the program step size 466 and the program step duration 467 result in a reduction in the PET 464; however, embodiments are not so limited.

As described further below, a relationship exists between the adjustment of a program step size and the adjustment of the program step duration. For instance, the adjustment of the program step size can be in a particular proportion to the adjustment of the program step duration based on a relationship between the program step size and the program step duration. As a result, level width can be adjusted by a particular amount by adjusting the program step size and/or duration by particular amounts based on the determined proportional relationship between step size and step duration and therefore respective effects on level width.

In various embodiments, the level width can be used as a feedback measure within the system, with the adjustment of one or more program step characteristics being used to adjust the level width toward a target level width responsive to a determination that the measured level width is above or below the target level width. As an example, as a level width goes above a threshold level width, a program step size and/or a program step duration can be adjusted to decrease the level width corresponding to a group of cells. Vice versa, as a level width goes below a threshold level width, a program step size and/or a program step duration can be adjusted to increase the level width. Dynamically adjusting or calibrating the programming step size 462, duration 459 to affect the level width is described further in association with FIGS. 5-8 below.

Figure 4C:
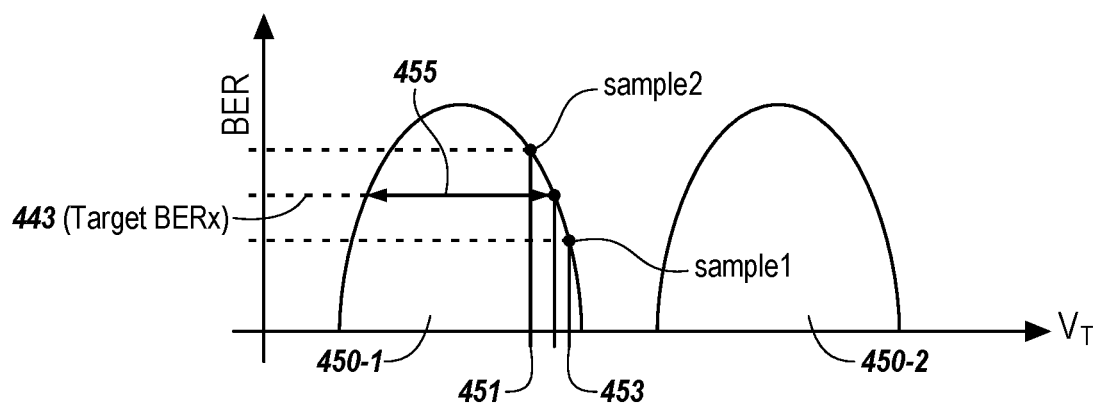
FIG. 4C illustrates a level width between threshold voltage distributions corresponding to memory cells programmed in accordance with some embodiments of the present disclosure.

FIG. 4C illustrates a level width 455 between threshold voltage (Vt) distributions 450-1 and 450-2 of memory cells programmed in accordance with some embodiments of the present disclosure. The example Vt distributions 450-1 and 450-2 (collectively referred to as Vt distributions 450) can be analogous to the Vt distributions shown in FIG. 3 (e.g., Vt distributions 334-1 334-8) and can correspond to a particular page of memory cells.

As illustrated in FIG. 4C, the level width 455 can be a distance between adjacent edges of the Vt distributions 450-1 450-2. The level width between Vt distributions can be calculated, for example, by determining a location of the Vt distribution edges (e.g., on x-axis) by performing multiple read operations on a page of programmed cells using different read voltages and monitoring the bit error rate to determine the read voltage at which a minimum BER occurs for the page. In a number of embodiments, and as described in FIG. 4C, a level width (e.g., 455) can be determined based on a particular (e.g., target) BER for a page of cells. The target BER for purposes of level width determination can be user selected and can be 1E-3 or 1E-4, for instance. As an example, determining the level width 455 can include reading the page of cells using a first read voltage 453 (shown as "sample 1"). The first read voltage 453 can be a trim value used to distinguish between cells programmed to state 450-1 and state 450-2. In this example, the read using read voltage 453 results in a BER below the target BER. A subsequent read of the page of cells using a different (e.g., lower) read voltage 451 (shown as "sample 2") is performed. In this example, the read at 451 results in a BER above the target BER. Since the read at read voltage 451 corresponds to a BER above the target BER and the read at read voltage 453 corresponds to a BER below the target BER, the x-axis location (e.g., voltage) corresponding to the target BER 443 can be determined by interpolating between sample 1 and sample 2.

For the above example, the interpolation between sample 1 and sample 2 to determine the relative x-axis location corresponding to the target BER (e.g., "TargetBERx") can be demonstrated by the formula:

$$\text{TargetBERx} = \text{Sample1} + [(\text{TargetBER} - \text{Sample1BER}) / (\text{Sample2BER} - \text{TargetBER})]$$

where "Sample1" is the read voltage 453 used for sample 1, "Sample1BER" is the BER determined for the read using read voltage 453 and "Sample2BER" is the BER determined for the read using read voltage 451.

A similar method can be employed to determine the x-axis location corresponding to the target BER for Vt distribution 450-2. Therefore, the level width 455 can be determined based on the difference between adjacent edges of Vt distributions 450-1 and 450-2 at the target BER 443. As described herein, the level width such as level width 455 can be summed with other level widths corresponding to a group (e.g., page) of cells to constitute an overall level width. In various embodiments of the present disclosure, a determined (e.g., measured) level width can be compared to a target level wdith, and programming signal characteristics such as step size and/or step duration can be adjusted in order to achieve the target level width.

FIG. 5 illustrates a graph 505 of at least a portion of a level width among example threshold voltage distributions of a particular page of memory cells in accordance with some embodiments of the present disclosure. The diagram illustrates a plurality of threshold voltage distributions 546-1, 546-1, 546-3, 546-4, 546-5, 546-6, 546-7 (hereinafter referred to collectively as 546), each representing a threshold voltage distribution that corresponds to a voltage programming level. Each of the threshold voltage distributions 546 corresponds to a voltage, illustrated as volts 542 along the x-axis. For example, a first threshold voltage distribution 546-1 corresponds to a voltage range of 0.5V to approximately 1.3V.

Each of the voltages corresponds to a register value 544. A rate 540 of the threshold voltage distributions 546 is illustrated along the y-axis. For example, as illustrated, each of the threshold voltage distributions covers a rate 540 ranging from $10^0$ to $10^4$. Each of the threshold voltage distributions include a level width that indicates a width spanning a voltage range. For example, a particular threshold voltage distribution 546-7 has a level width 548 that spans from approximately 4.75V to approximately 5.25V (or approximately 500 millivolts), as illustrated in FIG. 5.

Figure 6:
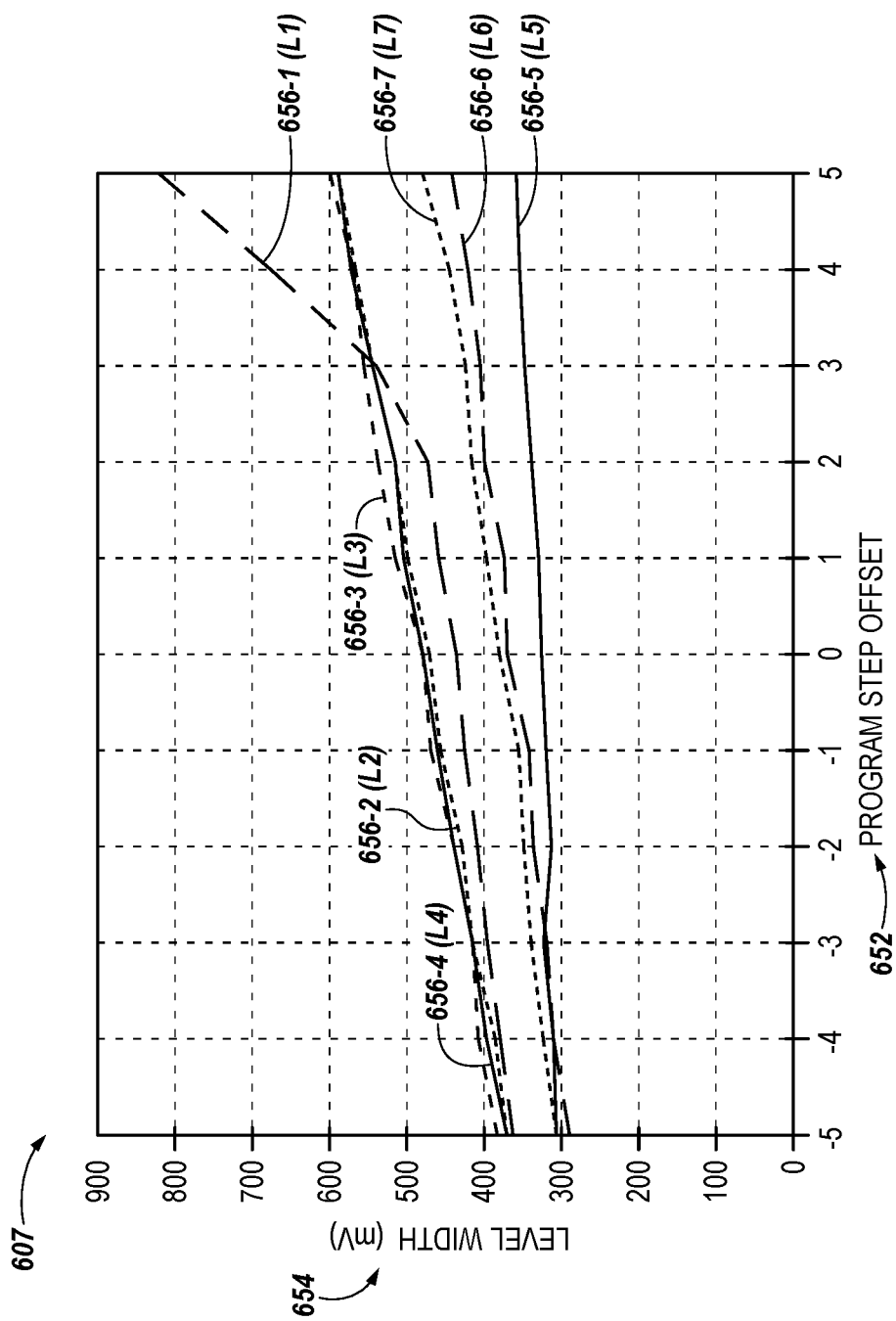
FIG. 6 is a diagram of an example level width distribution corresponding to adjusting one or more program step characteristics for programming memory cells in accordance with some embodiments of the present disclosure.

FIG. 6 is a graph 607 illustrating how adjusting one or more program step characteristics affects the level width in accordance with some embodiments of the present disclosure. The graph 607 illustrates a linear relationship between level widths 656-1 to 656-7 and program step size corresponding to a group of cells each programmed to one of eight Vt distributions (e.g., respective level widths across Vt distributions 334-1 to 334-8 shown in FIG. 3). The x-axis of graph 607 represents a program step size offset. As an example, an offset of "0" can correspond to a default program step size, with each increment or decrement to the offset representing a respective increase or decrease to the program step size (e.g., 10 mV, 100 mV, 1V, etc.). As shown in graph 607, the level widths 656-1 to 656-7 generally increase linearly with increased program step size. Accordingly, the level width can be adjusted by a known amount by adjusting (incrementing/decrementing) the program step size by a particular offset amount, which can allow the level width to be used as a feedback metric in order to maintain a target level width, for example. As is illustrated, there are only 7 level widths illustrated as the level width associated with L0 is not shown as it is the lowermost level (erase state).

Figure 7:
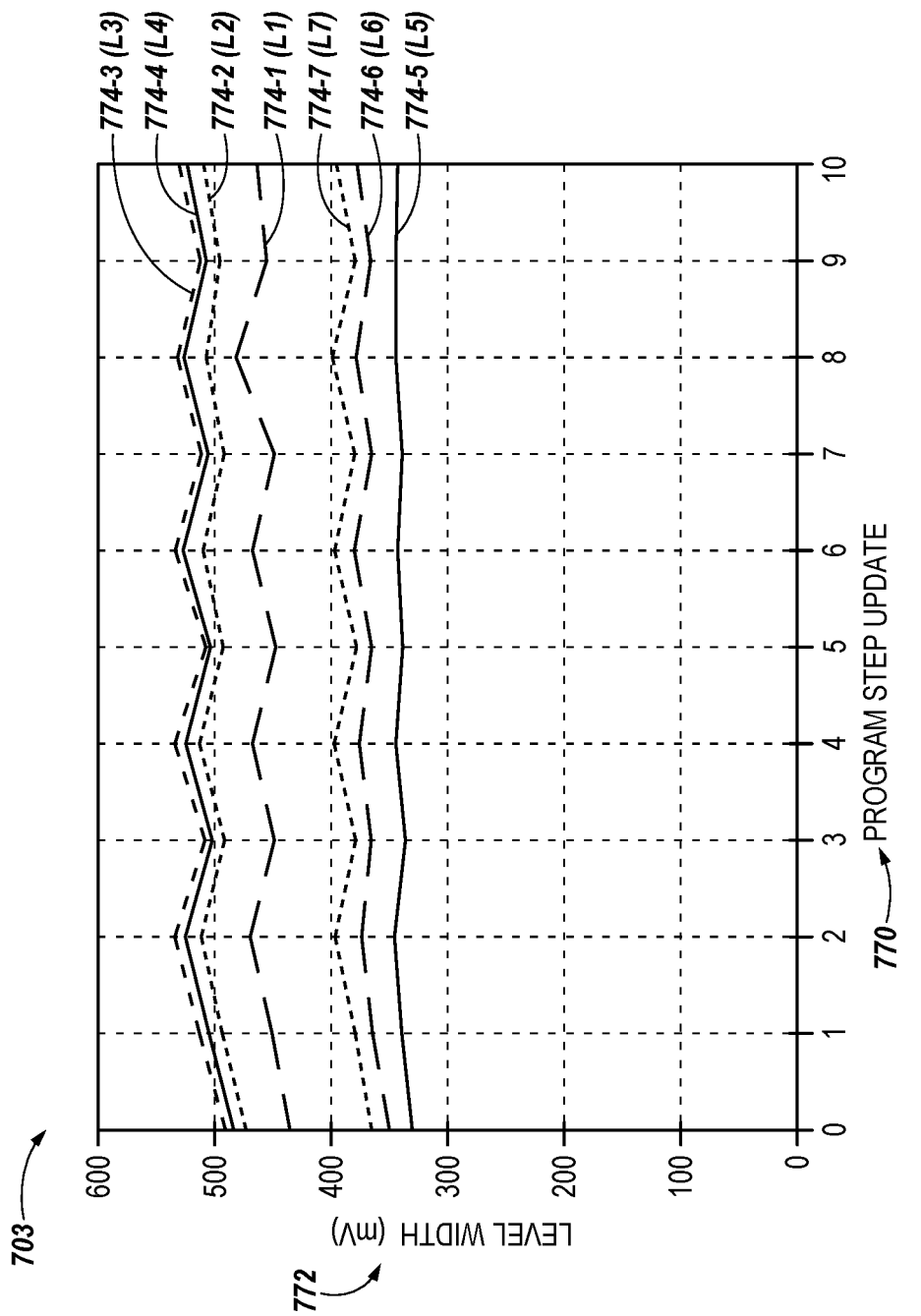
FIG. 7 is a diagram of an example level width distribution corresponding to adjusting one or more program step characteristics for programming memory cells in accordance with some embodiments of the present disclosure.

FIG. 7 is a graph 703 illustrating how adjusting one or more program step characteristics affects the level width in accordance with some embodiments of the present disclosure. The graph 703 illustrates a program step size update 770 and a corresponding change in level width 772 (in millivolts (mV) at each particular programming level 774-1 (level one programming, L1), 774-2 (L2), 774-3 (L3), 774-4 (L4), 774-5 (L5), 774-6 (L6), and 774-7 (L7, hereinafter referred to collectively as 774). A program step size update 770 refers to adjusting a program step size in order to fine-tune the corresponding level widths of each programming level. As an example, A fourth ("4") program step update 770 adjusts a level width 772 of a particular programming level 774-7 from approximately 375 mV (at program step update "3") to approximately 400 mV (at program step update "4"), adjusting (e.g., increasing) the level width of programming level 774-7 about 25 mV.

As is illustrated in FIG. 7, the level widths 772 of the corresponding program levels 774 are adjusted upward in one program step size update (e.g., such as level widths subsequent to program step size update "3") and then downward in the next program step size update (e.g., such as level widths subsequent to program step size update "4"). In this way, each program step size update 770 is adjusting a level width toward a target level width. In this example, programming level 774-7 is being adjusted toward a target level width 772 of approximately 390 mV as each increase and decrease is fine-tuning the level width towards this target level width. Likewise, programming level 774-1 is being adjusted towards a target level width of 460 mV, and so forth for each programming level and its corresponding level width illustrated in FIG. 7.

Figure 8:
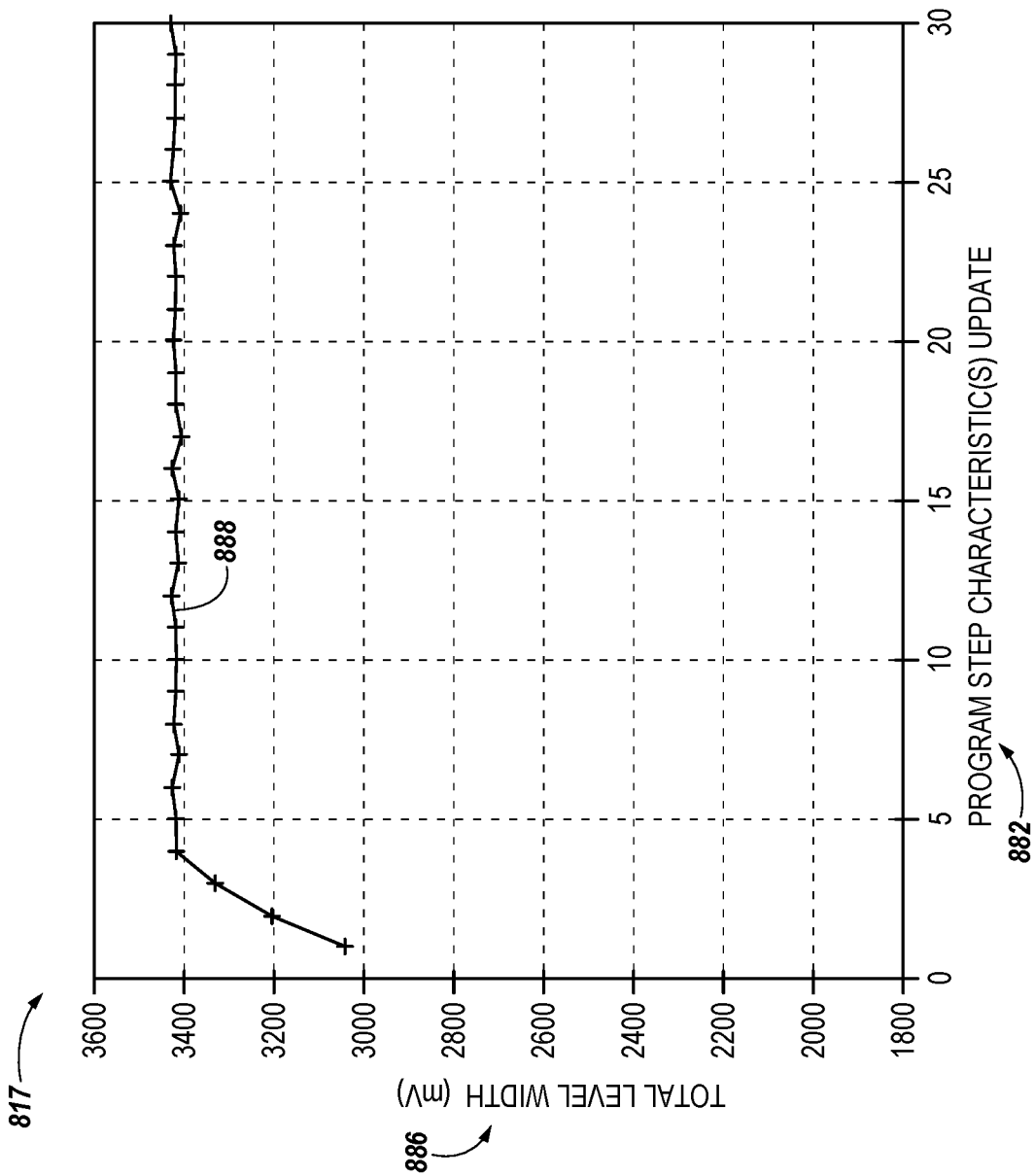
FIG. 8 is a diagram of an example level width distribution corresponding to adjusting one or more program step characteristics for programming memory cells in accordance with some embodiments of the present disclosure.

FIG. 8 is a graph 817 of an example level width distribution corresponding to adjusting one or more program step characteristics for programming memory cells in accordance with some embodiments of the present disclosure. The graph 817 illustrates a total level width 888 at corresponding program step characteristic(s) updates 882. A total level width 888 refers to a summation of level widths across a number of programming levels (such as programming levels 1 through 7, illustrated in FIGS. 6-7, or programming levels of an entire page(s) of data). The total level width values (along the y-axis, in millivolts (mV)) 886 range from approximately 3000 mV to 3425 mV, as is illustrated. Each of the program step characteristic update(s) 882 can include adjusting a program step size, adjusting a program step duration, and/or adjusting a program step size and a program step duration concurrently, simultaneously, and/or in succession. In this way, each of the program step characteristic(s) updates 882 is adjusting the total level width 888 toward a target total level width, which in this example is approximately 3425 mV. In this way, one or more program step characteristic(s) can be adjusted to adjust a level width to a target level width. A prior adjustment of a level width toward a target level width can be used as a feedback loop in a subsequent adjustment of the level width until the level width is equal to or within a threshold proximity to the target level width.

Figure 9:
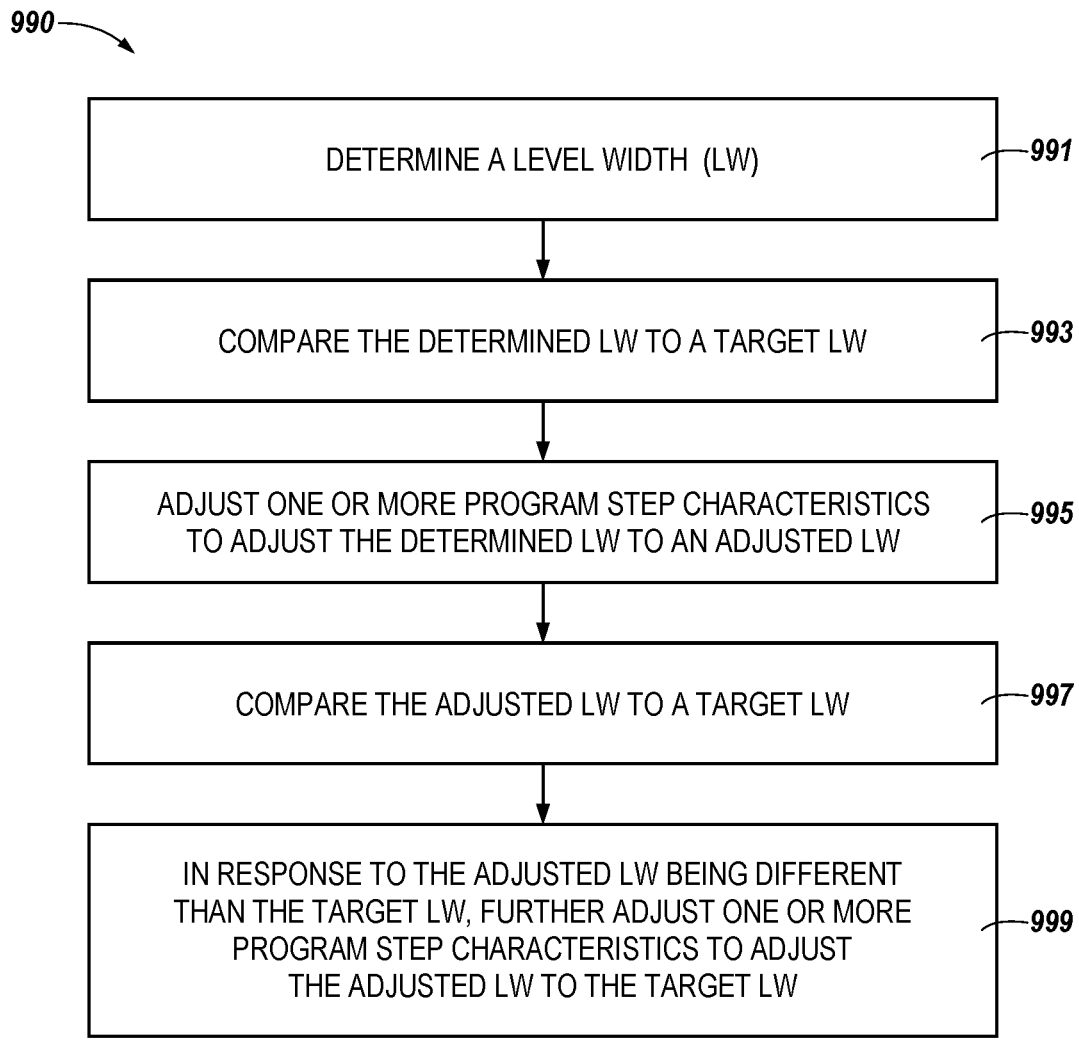
FIG. 9 is a flow diagram of an example method corresponding to adjusting one or more program step characteristics for adjusting a level width in accordance with some embodiments of the present disclosure.

FIG. 9 is a flow diagram of an example method 990 corresponding to adjusting one or more program step characteristics for programming memory cells in accordance with some embodiments of the present disclosure. The method 990 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 990 is performed by the program step characteristic component 115 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 991, the processing device (e.g., processing device 112) determines a level width (LW) among a plurality of threshold voltage distributions of a particular page of at least a portion of a plurality of memory cells of a memory component based on one or more program step characteristics. In some embodiments, program step characteristics can include at least one of a program step size or a program step duration, as described herein. In relation to program step duration, in at least one example, program step duration can be measured by counting clock cycles of a known frequency between a time a program command was issued to a memory (e.g., a NAND) and when the memory programming operation is complete. In another example, the program step duration can be measured by using a number of program pulses used to complete the memory program operation and apply a known amount of time for each pulse.

In some embodiments, determining the LW as illustrated at block 991 can be performed on a periodic basis, in response to a number of drive fills, a number of program/erase counts, a number of input/output (I/O) operations, and/or a temperature change exceeding a threshold value.

At block 993, the processing device compares the determined LW to a target LW. The target LW can be provided by an input to the memory system. The target LW can be provided based on an error threshold and/or other parameters or thresholds that can limit an LW value. At block 995, the processing device, in response to the determined LW being different than the target LW, adjusts the one or more program step characteristics. The processing device can adjust the one or more program step characteristics to adjust the determined LW to an adjusted LW. For example, the memory system can increase or decrease one or more program step characteristics (e.g., one or more of the program step size and/or program step duration), which will correspondingly increase or decrease the LW by a particular amount based on determined relationships. Either of these parameters can be adjusted, or both can be adjusted, to achieve a particular LW that can be adjusted toward the target LW.

A relationship can exist between a program step size (e.g., program gate step size) and a level width (LW). A relationship can exist between a program step duration (e.g., a program pulse duration time) and the LW. These relationships can be combined and used to correspond (e.g., in a linear or nonlinear relationship) to the change in LW with a particular resolution (e.g., a higher resolution). In this example, the change in the LW ("DeltaLW") can be equal to a change in program step size ("DeltaProgramStep") plus a change in program step duration ("DeltaProgramTime"), as demonstrated by the formula:

$$DeltaLW=DeltaProgramStep+DeltaProgramTime$$

where a known delta of a program step duration can be equivalent to one increment of a program step size. As an example, if one increment of a program step size results in a 5% change in LW and "n" number of increments of delta program step duration also results in a 5% change in LW, then changing the LW time by 5% can be accomplished by either changing the program step size by one increment or changing the program step duration by n number of increments. To change the LW by only 2%, the program step size can remain the same and the program step duration delta could be adjusted by (2%/5%)*n. To change the LW by 13%, the program step size delta could be 2, resulting in 2*5%=10% plus a change in the program step duration of (3%/5%)*n.

In one example, the two relationships can be treated as linear relationships. In one example, the two relationships that affect LW and/or programming time can be represented by a formula which can include dependencies and non-linear effects. In another example, the relationships can be represented as tables which are indexed in a linear fashion but output differing amounts based on their index. In this example where the delta program step size and the delta program step duration are used as a function, the combination of the two parameters can be computed for a given change in LW. As an example:

$$[Program\ Step, ProgramTime]=funcProgramStep\_ProgramTime(LWdelta)$$

In the example where the delta program step size and the delta program step duration is used as a table lookup, the combination of the two parameters can be pre-computed for a given change in LW, such as in Table 1 below.

TABLE 1

| TableIndex | ProgramStep | ProgramTime | LWdelta |
|---|---|---|---|
| 0 | −2 | 0 | −2.00 |
| 2 | −2 | 7 | −1.50 |
| 3 | −1 | 0 | −1.00 |
| 5 | −1 | 10 | −0.50 |
| 6 | 0 | 0 | 0.00 |
| 8 | 0 | 10 | 0.50 |
| 9 | 1 | 0 | 1.00 |
| 11 | 1 | 10 | 1.50 |
| 12 | 2 | 0 | 2.00 |
| 14 | 2 | 12 | 2.50 |

Note that the program step duration for the table index of 2 is 7 and the program step duration for the table index of 14 is 12, illustrating a non-linear relationship.

At block 997, the processing device compares the adjusted LW to the target LW. At block 999, in response to the adjusted LW being different than the target LW, the processing device further adjusts one or more program step characteristics to adjust the adjusted LW to the target LW.

Figure 10:
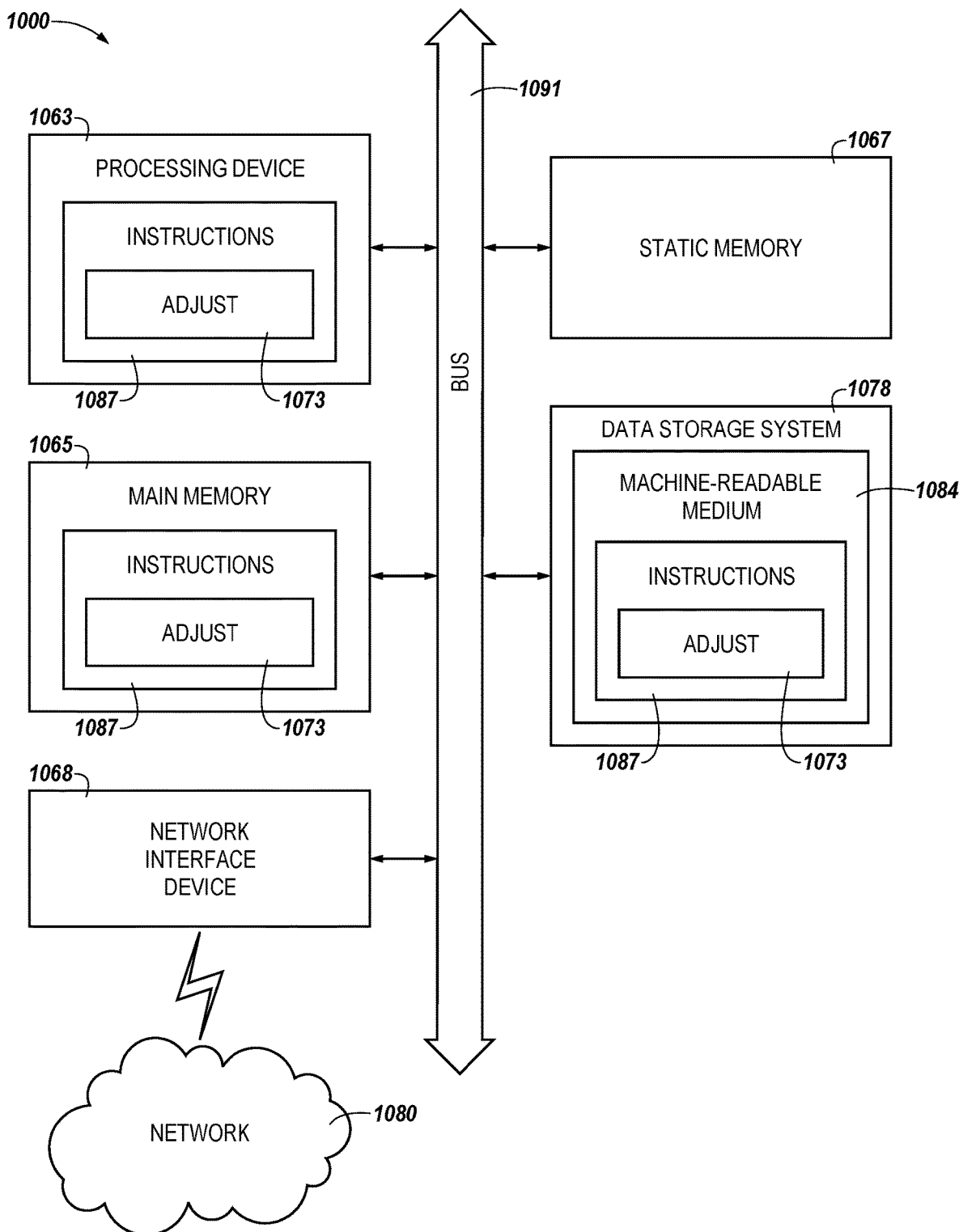
FIG. 10 is a block diagram of an example computer system in which embodiments of the present disclosure can operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 102 of FIG. 1) that includes, is coupled to, or utilizes a memory sub-system (e.g., the memory sub-system 104 of FIG. 1) or can be used to perform the operations of a controller (e.g., to adjust a parameter associated with programming a memory cell, such as program step characteristic component 115). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1063, a main memory 1065 (e.g., read-only memory (ROM), flash memory, dynamic random access memory (DRAM) such as synchronous DRAM (SDRAM) or Rambus DRAM (RDRAM), etc.), a static memory 1067 (e.g., flash memory, static random access memory (SRAM), etc.), and a data storage system 1078, which communicate with each other via a bus 1091.

Processing device 1063 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1063 can also be one or more special-purpose processing devices such as an application specific integrated circuit (ASIC), a field programmable gate array (FPGA), a digital signal processor (DSP), network processor, or the like. The processing device 1063 is configured to execute instructions 1087 for performing the adjustment operations using an adjustment component 1073 (including either or both of the program step size component and the program step duration component previously described) and steps discussed herein. The computer system 1000 can further include a network interface device 1068 to communicate over the network 1080.

The data storage system 1078 can include a machine-readable storage medium 1084 (also known as a computer-readable medium) on which is stored one or more sets of instructions 1087 or software embodying any one or more of the methodologies or functions described herein. The instructions 1087 can also reside, completely or at least partially, within the main memory 1065 and/or within the processing device 1063 during execution thereof by the computer system 1000, the main memory 1065 and the processing device 1063 also constituting machine-readable storage media. The machine-readable storage medium 784, data storage system 1078, and/or main memory 1065 can correspond to the memory sub-system 104 of FIG. 1.

In one embodiment, the instructions 1087 include instructions to implement functionality corresponding to a program step characteristic component (e.g., program step characteristic component 115 of FIG. 1). While the machine-readable storage medium 1084 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
   a memory component including a group of memory cells; and
   a processing device coupled to the memory component and configured to:
   determine a level width corresponding to the group of memory cells, wherein the level width is a sum of at least two level widths of at least two threshold voltage distributions corresponding to respective states to which the group of memory cells are programmed;
   compare the determined level width to a target level width; and
   in response to the determined level width being different than the target level width, adjust one or more program step characteristics to adjust the determined level width toward the target level width.

2. The system of claim 1, wherein the one or more program step characteristics comprises at least one of a step size or a step duration of a programming signal applied to the group of memory cells.

3. The system of claim 2, wherein the processing device is further configured to adjust the step size without adjusting the step duration to adjust the determined level width toward the target level width.

4. The system of claim 2, wherein the processing device is further configured to adjust the step duration without adjusting the step size of the programming signal to adjust the determined level width toward the target level width.

5. The system of claim 1, wherein the memory component comprises a plurality of pages of memory cells, and wherein the group of memory cells on which the level width is determined is one or more of the plurality of pages, the one or more pages being randomly selected for the level width determination.

6. The system of claim 1, wherein the group of memory cells comprises multi-level cells (MLCs).

7. The system of claim 6, wherein the group of cells comprises a plurality of pages of cells, and wherein the level width is determined for more than one of the plurality of pages of cells.

8. The system of claim 7, wherein the level width is determined on a page by page basis for the plurality of pages.

9. A method, comprising:
   determining a level width corresponding to a group of memory cells programmed via a programming signal having one or more program step characteristics, wherein the level width is a sum of level widths of at least two threshold voltage distributions corresponding to respective states to which the group of memory cells are programmed;
   comparing the determined level width to a target level width;
   in response to the determined level width being different than the target level width, adjusting the one or more program step characteristics to adjust the determined level width to an adjusted level width;
   comparing the adjusted level width to the target level width; and
   in response to the adjusted level width being different than the target level width, further adjusting the one or more program step characteristics to adjust the adjusted level width toward the target level width.

10. The method of claim 9, wherein:
    the one or more program step characteristics comprises a step size and a program step duration; and
    the method further comprises increasing the step size and the program step duration each by a respective particular amount in response to determining that the determined level width satisfies a threshold pertaining to the target level width.

11. The method of claim 9, wherein:
    the one or more program step characteristics comprises a step size and a program step duration; and
    the method further comprises decreasing the step size and the program step duration each by a respective particular amount in response to determining that the determined level width satisfies a threshold pertaining to the target level width.

12. The method of claim 9, further comprising repeating a comparison of a previously adjusted level width to the target level width.

13. The method of claim 12, wherein the method further comprises, in response to the previously adjusted level width being a different level width than the target level width, adjusting the one or more program step characteristics until the previously adjusted level width is a same level width as the target level width.

14. The method of claim 9, wherein the level width is a sum of the widths of respective threshold voltage (Vt) distributions corresponding to respective states to which the group of cells are programmed, and wherein determining the level width comprises, for each of the Vt distributions:
- determining voltages corresponding to respective first and second edges of the Vt distribution using an interpolation process based on a first read level voltage whose corresponding bit error rate (BER) is lower than a target BER and a second read level voltage whose corresponding BER is greater than the target BER; and
- using the determined voltages corresponding to the respective first and second edges to determine a width of the Vt distribution.

15. A system, comprising:
- a memory component including a plurality of memory cells; and
- a processing device coupled to the memory component and configured to:
  - compare a previously determined level width to a target level width, wherein a level width is a width of a threshold voltage distribution corresponding to a state to which the group of memory cells are programmed;
  - adjust one or more program step characteristics by a respective determined amount to adjust the previously determined level width toward the target level width;
  - wherein the level width is a sum of level widths among threshold voltage distributions of the plurality of memory cells.

16. The system of claim 15, wherein the one or more programs step characteristics comprises a step size and a program step duration time, and the respective determined amount is based on a determined relationship between the step size and the program step duration.

17. The system of claim 15, wherein the processing device is further configured to repeatedly adjust the one or more program step characteristics to maintain a constant level width at a target level width.

18. The system of claim 15, wherein processing device is further configured to adjust the one or more program step characteristics in response to a change in programming of the memory component.

19. The system of claim 18, wherein the change in programming comprises a change due to wear cycling of the memory component.

20. The system of claim 18, wherein the change in programming comprises a temperature change in the memory component.

* * * * *